US012622086B2

(12) United States Patent
Li et al.

(10) Patent No.: US 12,622,086 B2
(45) Date of Patent: May 5, 2026

(54) TRACING METHOD AND TRANSPORT DEVICE FOR SOLAR CELLS

(71) Applicants: ZHEJIANG JINKO SOLAR CO., LTD., Haining (CN); JINKO SOLAR CO., LTD., Jiangxi (CN)

(72) Inventors: Zongfang Li, Haining (CN); Junli Wu, Haining (CN); Jingsheng Jin, Haining (CN); Xinyu Zhang, Haining (CN); Wenqi Li, Haining (CN)

(73) Assignees: ZHEJIANG JINKO SOLAR CO., LTD., Haining (CN); JINKO SOLAR CO., LTD., Jiangxi (CN)

( * ) Notice: Subject to any disclaimer, the term of this patent is extended or adjusted under 35 U.S.C. 154(b) by 433 days.

(21) Appl. No.: 18/313,294

(22) Filed: May 5, 2023

(65) Prior Publication Data

US 2024/0178340 A1      May 30, 2024

(30) Foreign Application Priority Data

Nov. 29, 2022      (CN) .......................... 202211515798.4

(51) Int. Cl.
  *H10F 71/00*          (2025.01)
  *H10P 72/00*          (2026.01)
(52) U.S. Cl.
  CPC ......... *H10F 71/00* (2025.01); *H10P 72/0618* (2026.01)
(58) Field of Classification Search
  CPC .............................. H10F 71/00; H10P 72/0618
  See application file for complete search history.

(56) References Cited

FOREIGN PATENT DOCUMENTS

| CN | 111814499 A | | 10/2020 | |
|---|---|---|---|---|
| CN | 108538757 B | * | 12/2020 | .......... H10P 72/0612 |
| CN | 112766435 A | | 5/2021 | |
| CN | 114418372 A | | 4/2022 | |
| JP | 2016204966 A | | 12/2016 | |

OTHER PUBLICATIONS

Machine translation of CN-108538757-B, Shen, Jian. (Year: 2020).*
Machine translation of CN 111814499 A, Wu, Jun-li. (Year: 2020).*
Zhejiang Jinko Solar Co., Ltd., et al., European First Examination Report, EP 23172551.6, Feb. 12, 2025, 7 pgs.
Zhejiang Jinko Solar Co., Ltd., et al., Extended European Search Report, EP 23172551.6, Nov. 3, 2023, 8 pgs.

* cited by examiner

*Primary Examiner* — Mayla Gonzalez Ramos
(74) *Attorney, Agent, or Firm* — USCH Law, PC

(57)          ABSTRACT

The tracing method according to the present disclosure includes: coding solar cells disposed in a loading frame according to a frame code of a loading frame, such that each respective solar cell has a respective cell code; obtaining respective process information of the respective solar cell according to a loading order, where the process information includes a code of a process carrier, a code of a workbench and a position code of a solar cell in the process carrier; uploading cell codes and process information of the solar cells to a computer system; and recording and associating, by the computer system, the respective cell code and the respective process information.

20 Claims, 2 Drawing Sheets

Code solar cells disposed in a loading frame according to a frame code of the loading frame, such that each respective solar cell has a respective cell code          S101

Obtain respective process information of the respective solar cell according to a loading order          S102

Upload cell codes and process information of the solar cells to a computer system, the software system records the cell codes and the process information of the solar cells, and associates the respective cell code with the respective process information          S103

TRACING METHOD AND TRANSPORT DEVICE FOR SOLAR CELLS

CROSS REFERENCE TO RELATED APPLICATIONS

The present application claims the benefit of priority under the Paris Convention to Chinese Patent Application No. 202211515798.4 filed on Nov. 29, 2022, which is incorporated herein by reference in its entirety.

TECHNICAL FIELD

Embodiments of the present disclosure relate to the field of solar cells technology, and in particular to a tracing method and a transport device for solar cells.

BACKGROUND

Fossil energy causes air pollution and has limited reserves, while solar energy has the advantages of clean, pollution-free and rich resources. Thus, solar energy is gradually becoming the core clean energy to replace fossil energy. Because solar cells have good photoelectric conversion efficiency, solar cells have become the focus of development of clean energy.

An important factor affecting the proportion of solar energy in energy utilization is the photoelectric conversion efficiency of solar cells. In order to improve the photoelectric conversion efficiency of solar cells, a general idea of improving the performance of solar cells is to optimize and improve the manufacturing process and structural design of solar cells according to the performance of different solar cells in use, such as light absorption capacity, service life, failure rate and the like.

The production process of solar cells includes multiple processes. During the transport of solar cells among multiple processes, problems such as loss of process information of solar cells and confused record of process information are likely to occur, thereby resulting in poor record of the process information.

SUMMARY

Embodiments of the present disclosure provide a method and a transport device for tracing solar cells, which are at least conducive to accurate record of the process information of solar cells, so as to facilitate the traceability of the process information at the solar cell level.

Some embodiments of the present disclosure provide a method for tracing solar cells, including: coding solar cells disposed in a loading frame according to a frame code of the loading frame, such that each respective solar cell has a respective cell code; obtaining respective process information of the respective solar cell, according to a loading order in which the solar cells are transferred from the loading frame to a transport and grouping apparatus, where the respective process information includes a code of a process carrier configured to carry the solar cells, a code of a workbench configured to process the solar cells and a position code of the respective solar cell in the process carrier; uploading cell codes and process information of the solar cells to a computer system; and recording, by the computer system, the cell codes and the process information of the solar cells, and associating, by the computer system, the respective cell code with the respective process information.

In some embodiments, coding the solar cells disposed in the loading frame according to the frame code of the loading frame, includes: determining a cell code set for the solar cells according to the frame code of the loading frame, where the cell code set includes a plurality of cell codes; assigning a respective cell code in the cell code set to the respective solar cell according to the loading order; and caching the cell codes of the solar cells.

In some embodiments, determining the cell code set for the solar cells according to the frame code of the loading frame, includes: uploading the frame code of the loading frame to the computer system; determining, by the computer system, a maximum capacity of the loading frame according to the frame code of the loading frame; generating, by the computer system, the cell code set, where a number of the cell codes in the cell code set corresponds to the maximum capacity; and receiving the cell code set transmitted by the computer system.

In some embodiments, caching the cell codes of the solar cells, includes: receiving triggering information and cut-off information of a first sensor and triggering information and cut-off information of a second sensor, where the first sensor is disposed at an end of a transferring line configured for transferring the solar cells from the loading frame to the transport and grouping apparatus, and the second sensor is disposed at an inlet of the transport and grouping apparatus; and during transfer of the respective solar cell from the loading frame to the transport and grouping apparatus, in response to the triggering information of the first sensor being received prior to the triggering information of the second sensor and the cut-off information of the first sensor being received prior to the cut-off information of the second sensor, caching a cell code of the respective solar cell.

In some embodiments, after coding the solar cells disposed in the loading frame according to the frame code of the loading frame, the method further includes: receiving an output signal of a third sensor configured to monitor a respective state of each solar cell of the solar cells; determining a target solar cell according to the output signal, where the target solar cell refers to a damaged solar cell; and deleting a cell code corresponding to the target solar cell.

In some embodiments, the solar cells are transferred from the transport and grouping apparatus to the process carrier by a mechanical arm, and uploading the cell codes and process information of the solar cells to the computer system, includes: acquiring position information of the mechanical arm, to determine whether the mechanical arm returns to an initial position; and in response to determining that the solar cells are transferred to the process carrier and the mechanical arm returns to the initial position, uploading the cell codes and process information of the solar cells to the computer system.

In some embodiments, each solar cell of the solar cells further has a process code configured to indicate information of respective preceding processes performed on the respective solar cell, after uploading the cell codes and process information of the solar cells to the computer system, the method further includes: determining the respective cell code of each solar cell according to an unloading order in which the solar cells are transferred from the process carrier to the transport and grouping apparatus; acquiring a respective process code of the respective solar cell; and associating the respective cell code with the respective process code of the respective solar cell.

In some embodiments, determining the respective cell code of each solar cell according to the unloading order in which the solar cells are transferred from the process carrier to the transport and grouping apparatus, includes: sending a request to the computer system for the cell codes of the solar cells, where the request includes the code of the process carrier and the code of the workbench; receiving a collection of the cell codes sent by the computer system in response to the request; and determining the respective cell code of each solar cell of the collection of the cell codes according to the unloading order.

In some embodiments, after associating the respective cell code with the respective process code of the respective solar cell, the method further includes: acquiring a frame code of an unloading frame configured to receive the solar cells unloaded from the transport and grouping apparatus; uploading the cell codes and process codes of the solar cells and the frame code of the unloading frame to the computer system; and recording, by the computer system, the cell codes and the process codes of the solar cells and the frame code of the unloading frame, and associating, by the computer system, the frame code of the unloading frame with the cell codes and the process codes of the solar cells.

Some embodiments of the present disclosure provide a transport device for solar cells, including a computer system, and the computer system includes: at least one processor, and a memory being in communication connection with the at least one processor. The memory is configured to store instructions, which, when executed by the at least one processor, causes the at least one processor to implement operations of the method as illustrated above.

BRIEF DESCRIPTION OF THE DRAWINGS

One or more embodiments are exemplarily illustrated in reference to corresponding accompanying drawing(s), and these exemplary illustrations do not constitute limitations on the embodiments. Unless otherwise stated, the accompanying drawings do not constitute scale limitations.

DETAILED DESCRIPTION OF THE EMBODIMENTS

It can be known from the background art that the optimization and improvement of design and manufacture of solar cells depends on tracing of the process information of the solar cells. However, the tracing of the process information at the solar cell level is difficult to implement in the existing manufacture process for solar cells.

Some embodiments of the present disclosure provide a method for tracing solar cells. During loading process of the solar cells, solar cells disposed in a loading frame is coded according to the frame code of the loading frame. Respective process information of the respective solar cell is obtained according to a loading order, where the process information includes a code of a process carrier, a code of a workbench and a position code of a solar cell in the process carrier or the like. Cell codes and process information of the solar cells is uploaded to a computer system. The computer system records the cell codes and the process information of the solar cells, and associates each cell code of the cell codes with respective process information. By coding each solar cell according to the frame code of the loading frame and the loading order, and associating the process information acquired according to the loading order with the corresponding cell codes, the process information of the solar cells transferred during the manufacturing process can be recorded accurately, which is conducive to tracing of the process information at the solar cell level.

Embodiments of the present disclosure will be described in detail below with reference to the accompanying drawings. Those skilled in the art should understand that, in the embodiments of the present disclosure, many technical details are provided for the reader to better understand the present disclosure. However, even without these technical details and various modifications and variants based on the following embodiments, the technical solutions claimed in the present disclosure can be implemented.

Figure 1:
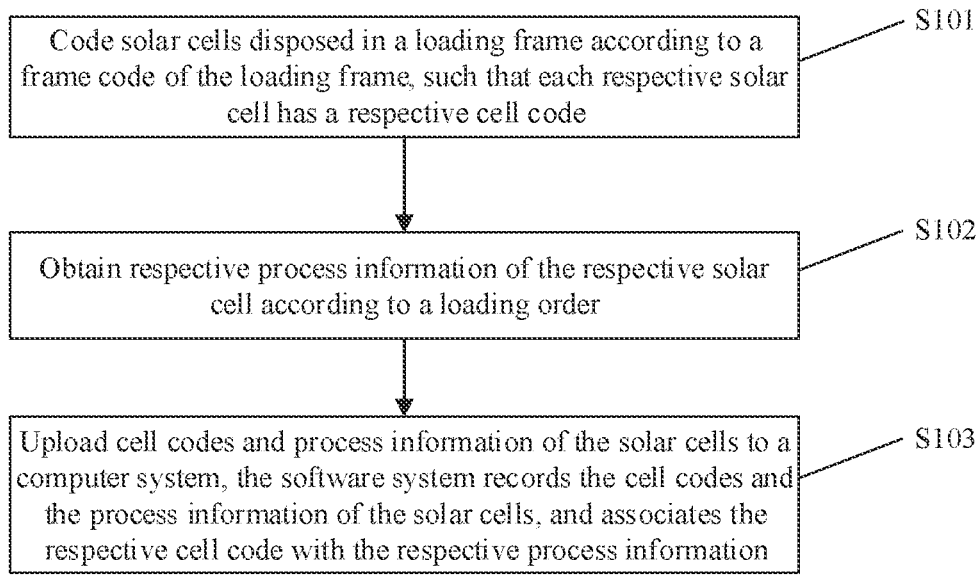
FIG. 1 is a flow chart of a method for tracing solar cells according to some embodiments of the present disclosure.

Some embodiments of the present disclosure provide a method for tracing solar cells, applicable to a transport device for solar cells, such as wafer-leading machine, automatic wafer-inserting machine or the like. Referring to FIG. 1 for a process of tracing and recording the process information of solar cells, the process includes, but not limited to, the following operations.

At S101, each solar cell of solar cells disposed in the loading frame is coded according to a frame code of a loading frame, such that each solar cell has a respective cell code.

During the manufacture and transfer of the solar cells, the transport device for solar cells monitors transport tracks connected to itself, and acquires the frame code of the loading frame in response to detecting that the loading frame arrives at a loading position on the transport tracks. Then the transport device for solar cells codes each solar cell of the solar cells disposed in the loading frame according to the frame code of the loading frame, such that each solar cell in the loading frame is marked and has a respective cell code.

The loading frame may have a plurality of types of frame code. As an example, a radio frequency identification chip which is written in corresponding identification data may be installed on the loading frame in advance, and the identification data may include information such as a type of frame, a maximum capacity or the like. After the loading frame arrives at a specified position, the transport device for solar cells acquires, by a sensor, a code corresponding to the radio frequency identification chip on the loading frame as the frame code. As another example, an identification quick response (QR) code may be disposed on a surface of the loading frame, and the transport device for solar cells may acquire the frame code of the loading frame by scanning and parsing the identification QR code. Embodiments of the present disclosure are not limited to the above-mentioned identification methods for the frame code and types of the frame code.

Moreover, the cell codes may be codes enabling the solar cells to be accurately identified, such as virtual identification data, character strings generated by a preset base, extension codes obtained by adding extension fields to the frame code of the loading frame or the like. Embodiments of the present disclosure are not limited to the above-mentioned implementations of the cell codes.

In some embodiments, coding, according to the frame code of the loading frame, each solar cell of the solar cells disposed in the loading frame, includes: determining, according to the frame code of the loading frame, a cell code set including a plurality of cell codes for the solar cells; assigning, according to the loading order in which the solar cells are transferred from the loading frame to a transport and grouping apparatus, a respective cell code in the cell code set to the each solar cell in sequence; and caching the cell codes of the solar cells.

After acquires the frame code of the loading frame, the transport device for solar cells acquires the corresponding cell code set according to the frame code, and caches the acquired cell code set. Then the solar cells are taken out in sequence according to a respective position of each solar cell in the loading frame, and are transferred, by a transferring line, to the transport and grouping apparatus according to the taking-out order. In this way, loading of the solar cells are implemented. During the transfer of the solar cells from the loading frame to the transport and grouping apparatus, a respective cell code included in the cached cell code set is assigned to each solar cell and cached according to the loading order in which the solar cells are transferred from the loading frame to the transport and grouping apparatus.

By assigning a respective cell code included in the cached cell code set derived from the frame code to each solar cell according to the loading order in which the solar cells are transferred to the transport and grouping apparatus, and recording the respective cell code, the solar cells can be properly coded according to the loading order, which is conducive to the accurate trace of the solar cells according to the cell codes in subsequent process flows, thereby ensuring accurate acquirement of the process information of the solar cells.

In some embodiments, determining, according to the frame code of the loading frame, the cell code set for the solar cells, includes: uploading the frame code of the loading frame to the computer system; determining, by the computer system, a maximum capacity of the loading frame according to the frame code of the loading frame; generating, by the computer system, the cell code set, where a number of the cell codes in the cell code set corresponds to the maximum capacity; and receiving the cell code set transmitted by the computer system.

The transport device for solar cells generally has a poor storage and computing performance. In view of this, information such as identification data of the loading frame may be stored in the computer system in advance, and the transport device for solar cells may acquire the cell code set corresponding to the frame code by the interaction with the computer system. After acquires the frame code of the loading frame, the transport device for solar cells uploads the frame code of the loading frame to the computer system. Upon receiving the frame code reported by the transport device for solar cells, the computer system queries in pre-stored identification data according to the received frame code, to determine a maximum capacity of the loading frame for accommodating solar cells. Then the computer system generates, according to a preset generation rule for cell code set and based on the maximum capacity of the loading frame, the cell code set, and a number of the cell codes in the cell code set corresponds to the maximum capacity. Then the computer system transmits the cell code set to the transport device for solar cells. The transport device for solar cells receives the cell code set transmitted by the computer system, and assigns, according to the order in which the solar cells are transferred from the loading frame to the transport and grouping apparatus, a respective cell code to each solar cell.

When generating the cell code set according to the maximum capacity of the loading frame, the computer system may query a history transmitting record for cell code sets and derive a record of used cell codes. The computer system may generate the cell codes of the cell code set according to formats of the historic cell codes. During the generation of the cell code set, a cell code which is the most adjacent to the used cell codes is taken as a starting cell code of the cell code set. In this way, consistency of the formats of cell codes and continuity of the cell codes can be ensured, thereby facilitating to query of the solar cells and preventing confusion of the cell codes.

In some embodiments, the transport device for solar cells and the computer system may be built using the C/S architecture, that is, the transport device for solar cells as the client and the computer system as the server are set separately, and the computer system communicates with the transport device for solar cells in the way of polling interaction, so as to ensure that the transport device for solar cells can accurately transfer the solar cells, and the production cost and difficulty of the transport device for solar cells can be reduced. In some other embodiments, the computer system may be directly set in the transport device for solar cells, as a system independent of the control system of the transport device for solar cells, and information exchange between the computer system and the control system is implemented by communication based on inter-system protocol. By integrating the two systems in the transport device for solar cells, the fault-tolerant capability of the transport device for solar cells on cell transfer can be improved, and influence on the transfer of the solar cells due to failure or abnormality of the communication between the transport device for solar cells and an external device can be prevented.

In some embodiments, caching the cell codes of the solar cells, includes: receiving triggering information and cut-off information of a first sensor and triggering information and cut-off information of a second sensor, where the first sensor is disposed at an end of a transferring line configured for transferring the solar cells from the loading frame to the transport and grouping apparatus, and the second sensor is disposed at an inlet of the transport and grouping apparatus; and during transfer of a solar cell from the loading frame to the transport and grouping apparatus, in response to the triggering information of the first sensor being received prior to the triggering information of the second sensor and the cut-off information of the first sensor being received prior to the cut-off information of the second sensor, caching a cell code of the solar cell.

During transfer of the solar cells from the loading frame to the transport and grouping apparatus via the transferring line, abnormalities such as jammed or stacked solar cells may occur, resulting in that an order in which the solar cells pass the end of the transferring line to enter the transport and grouping apparatus is not in line with an order in which the solar cells are taken out of the loading frame. Thus, the cell codes cached by the transport device for solar cells may be not in line with the actual cell codes of the solar cells, and a problem that a caching order of the cell codes is not in correspondence to the actual order in which the solar cells enter the transport and grouping apparatus may occur.

In view of this, the triggering information and cut-off information of the first sensor and the triggering information and cut-off information of the second sensor is monitored during transferring the solar cells from the loading frame to the transport and grouping apparatus and recording the cell codes of the solar cells, where the first sensor is disposed at the end of the transferring line configured for transferring the solar cells from the loading frame to the transport and grouping apparatus, and the second sensor is disposed at the inlet of the transport and grouping apparatus. Before caching the cell codes, a transfer process, passing the first and second sensors, of the solar cells assigned with the cell codes is check. During transfer of any individual solar cell of the solar cells passing the first and second sensors, in response to the triggering information of the first sensor being received prior to the triggering information of the second sensor and the cut-off information of the first sensor being received prior to the cut-off information of the second sensor, it is determined that the transfer of the solar cell is normal and the solar cell is in a correct transfer order, and the cell code of the solar cell is cached. Otherwise, in the cases such that the triggering information of the first sensor is received later than the triggering information of the second sensor, the cut-off information of the first sensor is received later than the cut-off information of the second sensor, the triggering information of the first sensor is not received but the triggering information of the second sensor is received, the cut-off information of the first sensor is not received but the cut-off information of the second sensor is received or the like, it is determined that the transfer of the solar cell is abnormal, and the transfer of the solar cell may be interrupted. Moreover, the cell code of the solar cell may be marked as abnormal and be reported to the computer system.

By setting a judgement condition that the first sensor disposed at the end of the transferring line is triggered or cut off prior to the second sensor disposed at the inlet of the transport and grouping apparatus, it can be secured that the cached cell codes are in strict correspondence to the order in which the solar cells are transferred, and confusion, error or repetition of the cached cell codes can be prevented. In this way, accuracy of the record of the cell codes can be improved, thereby securing accuracy of the record of subsequent process information.

In some embodiments, after coding, according to the frame code of the loading frame, each solar cell of the solar cells, further including: receiving an output signal of a third sensor configured to monitor a respective state of each solar cell of the solar cells; determining a target solar cell according to the output signal, where the target solar cell refers to a damaged solar cell; and deleting a cell code corresponding to the target solar cell.

In the transfer process of the solar cells, after coding the solar cells, the transport device for solar cells monitor the states of the solar cells by a third sensor. The third sensor may be a photoelectric sensor, and a respective third sensor may be disposed on at least one of the process carrier and the workbench. The third sensor is configured to monitor the states and shapes of the solar cells, upon the states and/or shapes of the solar cells change, the third sensor outputs varied photoelectric detection results. In some embodiments, the third sensor may be a Hall sensor. The Hall sensor is configured to monitor the magnetic field of each solar cell and output different voltages depending on the magnetic field of each solar cell. Upon the state and/or shape of a solar cell change, the Hall sensor outputs varied voltages depending on the change in the magnetic field of the solar cell.

In the transfer process of the solar cells, the output signal of the third sensor is acquired, and whether each solar cell is damaged during transfer is determined depending on whether there is a change in the output signal, thereby picking out damaged target solar cells. After determining the target solar cells to which the corresponding output signals change, the cell codes of the target solar cells are cached and recorded or are deleted according to the order in which the target solar cells are transferred. Moreover, a mechanical arm or a technician may be instructed to intervene to remove the damaged target solar cells, to prevent the damaged solar cells from interfering with transfer and processing of the normal solar cells, thereby improving safety of the transfer and processing of the solar cells.

By disposing the third sensor, it can be detected whether there is any damaged solar cell of the solar cells being transferred, and once damaged target solar cells are detected, the target solar cells can be removed and the cell codes of the target solar cells can be deleted. In this way, confusion in the cell codes can be prevented, and the damaged solar cells can be prevented from interfering with transfer and processing of the normal solar cells, thereby improving safety and accuracy of the transfer and processing of the solar cells.

At S102, respective process information of each solar cell is acquired according to a loading order in which the solar cells are transferred from the loading frame to the transport and grouping apparatus.

During transfer and processing of the solar cells, the transport device for solar cells transfers the solar cells from the loading frame to the transport and grouping apparatus according to an order in which the solar cells are disposed in the loading frame, and codes each solar cell according to the loading order during transfer. In response to a number of solar cells in the transport and grouping apparatus reaching a preset value, such as a maximum capacity or a preset capacity for solar cells of the transport and grouping apparatus, the solar cells in the transport and grouping apparatus are transferred to the specified process carrier, such as a graphite boat, a quartz boat or the like. The positions of the solar cells in the process carrier depend on an order in which the solar cells are transferred to the process carrier. Thus, during transfer of the solar cells, a code of the process carrier to which the solar cells are transferred and a respective position code of each solar cell in the process carrier are acquired.

Then the workbench at which processing of the solar cells is performed is traced according to the code of the process carrier, to acquire a code of the workbench. The code of the workbench may be a code of a main machine, a serial number of a furnace tube in the main machine, an identification code pre-assigned to the workbench or the like. In this way, the process information including the code of the process carrier, the code of the workbench and the position codes in the process carrier can be traced according to the order in which the solar cells are loaded and transferred during performance of process tasks, thereby acquiring accurate process information of the solar cells.

Figure 2:
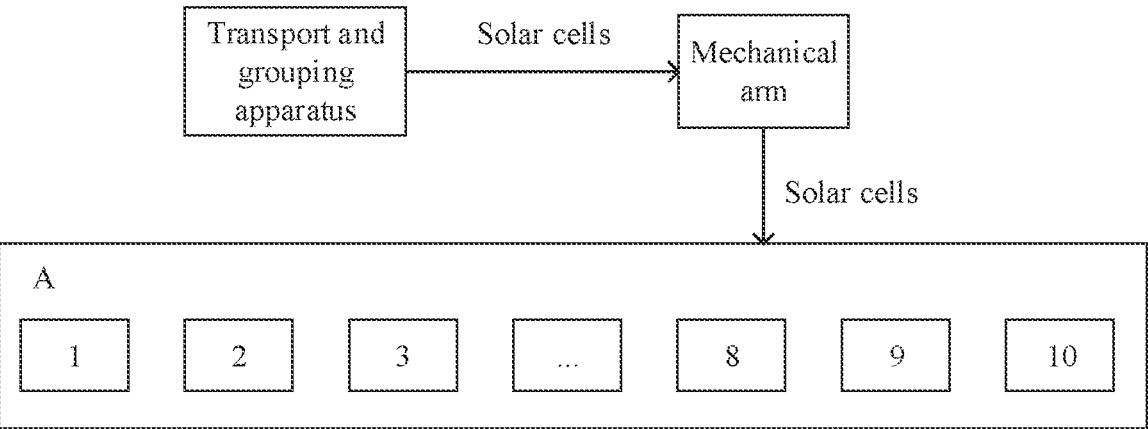
FIG. 2 is a schematic diagram of a transport process of solar cells according to some embodiments of the present disclosure.

In some embodiments, the position codes in the process carrier may be pre-assigned, according to a preset rule, to the recesses for receiving solar cells in the process carries. For example, a code of a boat base is pre-assigned to the graphite boat, then the recesses of the graphite boat are coded by incremental numbers according to an order in which the solar cells are disposed in the recesses. Referring to FIG. 2, the boat base of the graphite boat is coded as A, and during trace of the position information of the solar cells in the graphite boat, the position codes of the solar cells consisting of the code of the boat base and the codes of the recesses are acquired according the order in which the solar cells are transferred from the transport and grouping apparatus to the graphite boat. For example, a position code of a third solar cell transferred into the graphite boat is A3, and a position code of a tenth solar cell transferred into the graphite boat is A10.

Moreover, in order to ensure the consistency of format of the position codes, the recesses may be coded in a single format according to the maximum capacity of the graphite boat for solar cells. For example, the maximum capacity of the graphite boat for solar cells is 90, then the first recess may be coded as 01, and the 90th recess may be coded as 90. By generating the position codes of the solar cells in the process carrier by the code of the boat base and the codes of the recesses, the positions of the solar cells in the process carrier can be accurately marked, which is conducive to the accurate trace of the solar cells and acquirement of the process information.

In some embodiments, during the acquirement of the process information and process trace, trace may be further performed on information such as processing durations of the solar cells on the workbench and processing parameters of the workbench, for example, temperatures, material ratios and the like. The above-mentioned process information may be also incorporated into the process information corresponding to the cell codes. In this way, the process information of the solar cells can be recorded completely and accurately as much as possible.

At S103, the cell codes and the process information of the solar cells are uploaded to the computer system; and the computer system records the cell codes and the process information of the solar cells, and associates each cell code of the cell codes with respective process information.

Upon the processing tasks are finished, the transport device for solar cells uploads the cell codes and the process information corresponding to the cell codes to the computer system, such that the computer system records the cell codes and the process information corresponding to the cell codes, and associates each cell code with respective process information. In this way, the process information of the solar cells during the process tasks can be accurately recorded, which facilitates the trace of the process information at the solar cell level and is conducive to optimization of design and process of the solar cells according to trace results of the process information.

Figure 3:
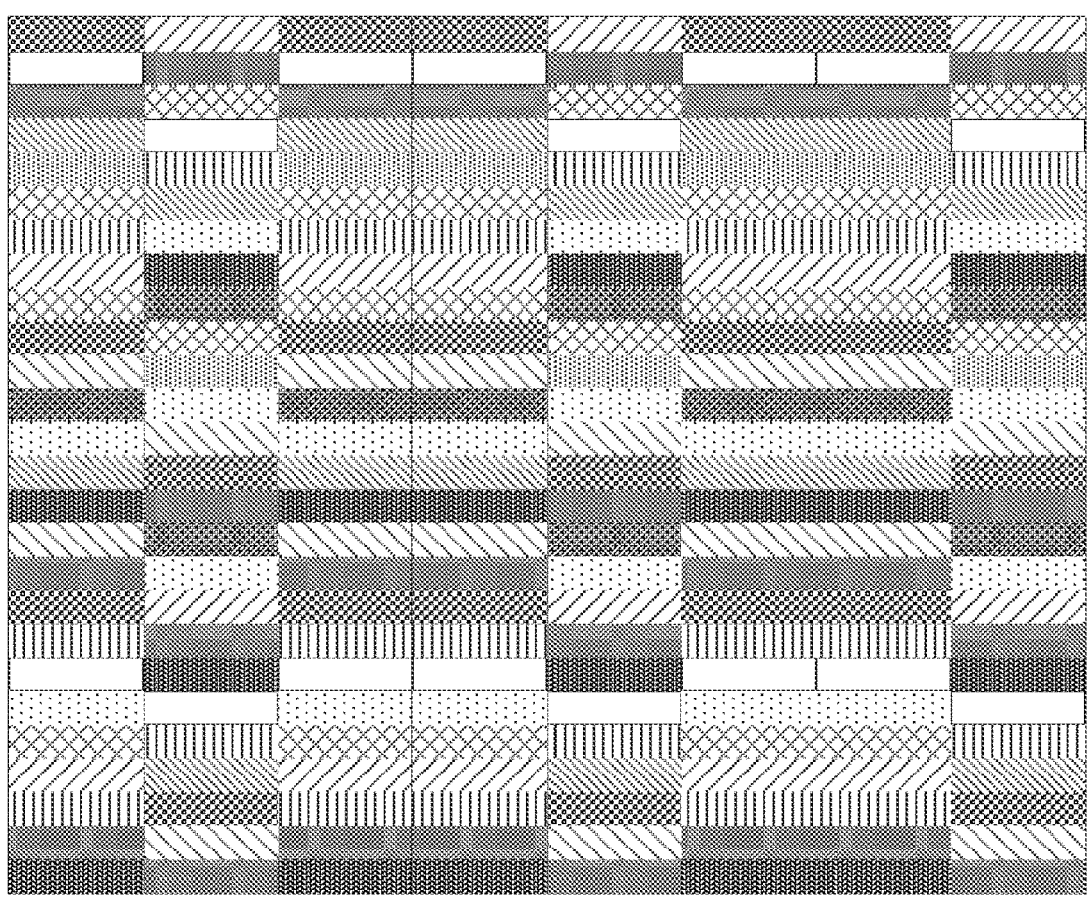
FIG. 3 is an effect diagram of the performance analysis for solar cells according to some embodiments of the present disclosure.

With the cell codes and the process information being associated and recorded, when the process information is traced and performance of the solar cells is analyzed using the computer system, the positions of the solar cells in the process carrier may be used as a basis for the analysis. Referring to FIG. 3, the process carrier is a graphite boat having 8 columns of and 26 lines of recesses, and each rectangle represents a solar cell occupying the corresponding recess. During the performance analysis of a batch of solar cells, each rectangle is filled according to the position code of corresponding solar cell in the process carrier and the actually measured performance of each solar cell, such as the test performance including the film thickness of the solar cell, the optical refractive index of the solar cell, the photoelectric conversion efficiency of the solar cell, the open-circuit voltage or the short-circuit current and the like. By using different filling patterns and/or colors to visually display the change of the performance of each solar cell with the position of each solar cell in the graphite boat, the performance of the solar cells can be analyzed based on the process information.

In some embodiments, the solar cells are transferred to the process carrier by a mechanical arm, and uploading the cell codes and process information of the solar cells to the computer system, includes: acquiring position information of the mechanical arm, to determine whether the mechanical arm returns to an initial position; and in response to determining that the solar cells are transferred to the process carrier and the mechanical arm returns to the initial position, uploading the cell codes and process information of the solar cells to the computer system.

During transfer of the solar cells from the loading frame to the transport and grouping apparatus, in response to a number of the solar cells in the transport and grouping apparatus reaching a preset number, the transport device for solar cells controls the mechanical arm to transfer the solar cells in the transport and grouping apparatus to the process carrier for the subsequent processing. After determining the process carrier corresponding to the solar cells and the positions of the solar cells in the process carrier according to the transfer order of the solar cells, the transport device for solar cells determines the corresponding workbench for the subsequent processing of the solar cells according to a correspondence relationship between the process carrier and the workbench, thereby determining the process information of the solar cells during processing. During transfer of the solar cells, real-time position information of the mechanical arm is monitored. In response to a solar cell being transferred into the process carrier by the mechanical arm, and the mechanical arm returning to an initial position for taking a solar cell out of the transport and grouping apparatus, the transport device for solar cells uploads the cell code and the process information of the solar cell to the computer system. The timing of uploading the information may be the moment that the mechanical arm returns to the initial position, or the moment before the mechanical arm transfers a next solar cell.

By monitoring the position information of the mechanical arm configured to transfer the solar cells to the process carrier, and triggering the uploading of the cell codes and process information of the solar cells which have been transferred into the process carrier to the computer system based on the action of the mechanical arm transferring the solar cells, an erroneous uploading of the cell codes and process information can be prevented, and accuracy of the cell codes and process information associated and recorded by the computer system can be secured.

Moreover, during the transfer of the solar cells by the mechanical arm and during the transfer of the solar cells to the processes subsequent to the processing or to an unloading frame, the states of the solar cells may be continuously monitored by the third sensor. Upon any damaged target solar cell is detected, the cell code of the target solar cell is deleted according to the process information or transfer order of the target solar cell, and a technician or the mechanical arm is instructed to remove the damaged target solar cells, to secure safety of the transfer and processing of the solar cells.

In some embodiments, each solar cell of the solar cells further has a process code configured to indicate information of respective preceding processes performed on the each solar cell, after uploading the cell codes and process information of the solar cells to the computer system, the method further includes: determining, according to an unloading order in which the solar cells are transferred from the process carrier to the transport and grouping apparatus, the respective cell code of each solar cell; acquiring a respective process code of the each solar cell; and associating the respective cell code with the respective process code of the each solar cell.

A process code having indication function may be disposed in advance on each solar cell of the solar cells transferred by the transport device for solar cells. The process code may be configured to indicate information of respective preceding processes performed on the respective solar cell, such as the information of the crystal bar from which a solar cell originates and of a position of the crystal from which the solar cell originates in the crystal bar. The process code also may be generated based on the information of all preceding processes performed on the solar cell. After the processing of the solar cells in the process carrier, the solar cells are unloaded from the process carrier to the transport and grouping apparatus and then to the unloading frame, or are transferred to a next main machine for the subsequent processing. The transport device for solar cells may include a decoder configured to acquire and parse the process code on each solar cell during unloading. During the unloading of the solar cells in the process carrier, a respective cell code of each solar cell is determined according to the unloading order in which the solar cells are transferred from the process carrier to the transport and grouping apparatus, and the determined respective cell code of each solar cell is associated with the acquired process code on each solar cell.

By the association of the cell codes with the process codes, and the association of the cell codes with the process information by the computer system, an association of the process information of each solar cells with the respective preceding processes performed on the each solar cell can be obtained. In this way, all process information of each solar cell can be associated and recorded, which facilitates the trace of the process information in the entire production process of each solar cell.

In some embodiments, determining, according to the unloading order in which the solar cells are transferred from the process carrier to the transport and grouping apparatus, the respective cell code of each solar cell, includes: sending a request to the computer system for the cell codes of the solar cells, where the request includes the code of the process carrier and the code of the workbench; receiving a collection of the cell codes sent by the computer system in response to the request; and determining, according to the unloading order, the respective cell code of each solar cell of the collection of the cell codes.

During the transport device for solar cells determines the cell codes of the unloaded solar cells, a request is sent to the computer system for the cell codes of the unloaded solar cells, and the request carries the codes of the process carrier and the workbench which were used during the processing of the solar cells. In response to receiving the request sent by the transport device for solar cells, the computer system retrieves, according to the codes of the process carrier and the workbench carried in the request, in the cached process information, to determine the solar cells whose process information includes codes of the process carrier and the workbench identical to those carried in the request. Then the computer system determines the unloading order of the unloaded solar cells according to the position codes of the solar cells in the process carrier, sorts the cell codes of the solar cells according to the unloading order to generate the collection of the cell codes, and sends the generated collection of the cell codes to the transport device for solar cells. In response to receiving the collection of the cell codes sent by the computer system, the transport device for solar cells reads, according to the unloading order, each cell code of the collection of the cell codes in sequence, as a respective cell code of each solar cell of the unloaded solar cells.

The transport device for solar cells acquires the collection of the cell codes of the unloaded solar cells according to the codes of the process carrier and the workbench for the unloaded solar cells, and determines a respective cell code for each solar cell of the unloaded solar cells according to the unloading order. In this way, accuracy of identification of cell codes can be improved, and confusion in association of process information due to the confusion in identification of cell codes can be prevented, thereby improving the accuracy of association and trace of process information.

Moreover, the computer system may sort, according to a loading order in which the solar cells are transferred to the process carrier, the cell codes of the solar cells to generate the collection of the cell codes. During unloading, the transport device for solar cells may unload the solar cells in the loading order for the solar cells, or may unload the solar cells in an order opposite to the loading order. In the case that the solar cells are unloaded in the loading order, the transport device for solar cells reads each cell code of the collection of the cell codes in sequence, as a respective cell code of each unloaded solar cell. Otherwise, in the case that the solar cells are unloaded in the order opposite to the loading order, the transport device for solar cells reads, in an inverted manner, each cell code of the collection of the cell codes, as a respective cell code of each unloaded solar cell. The embodiments of the present disclosure are not limited to the above-mentioned generation method of the collection of the cell codes.

In some embodiments, after associating the respective cell code with the respective process code of the each solar cell, the method further includes: acquiring a frame code of an unloading frame configured to receive the solar cells unloaded from the transport and grouping apparatus; uploading the cell codes and process codes of the solar cells and the frame code of the unloading frame to the computer system; and recording, by the computer system, the cell codes and the process codes of the solar cells and the frame code of the unloading frame, and associating, by the computer system, the frame code of the unloading frame with the cell codes and the process codes of the solar cells.

After transferring the solar cells from the process carrier to the transport and grouping apparatus, the transport device for solar cells further transfers the solar cells into the unloading frame, and transports, by transferring the unloading frame, the solar cells to the main machine for subsequent processes or to a storage area. During unloading of the solar cells, the frame code of the unloading frame for receiving the unloaded solar cells is acquired. A disposing method for the frame code of the unloading frame and the implementation of the frame code of the unloading frame are similar to those for the frame code of the loading frame, and will not be repeated here. In response to a number of the solar cells in the unloading frame reaching a preset number, the transfer of the unloading frame starts, and the cell codes and process codes of the solar cells and the frame code of the unloading frame are uploaded to the computer system. The computer system records the cell codes and the process codes of the solar cells and the frame code of the unloading frame, and associates the frame code of the unloading frame with the cell codes and the process codes of the solar cells. In this way, all process information and transfer information of the solar cells during manufacture can be associated and recorded, which facilitates the trace and analysis of the manufacture process of the solar cells.

Moreover, during the uploading of the cell codes and process codes of the solar cells and the frame code of the unloading frame, an individual unloading frame is used as a unit for unloading the solar cell and uploading information to prevent confused uploading of information. In response to a number of the solar cells in the unloading frame reaching a preset number, a respective cell code of each solar cell in the unloading frame is determined according to the transfer order of the solar cells and a respective process code of each solar cell is queried. Then the cell codes and process codes of the solar cells in the unloading frame and the frame code of the unloading frame are uploaded to the computer system.

In the method for tracing solar cells provided in the above embodiments, each solar cell of the solar cells disposed in the loading frame is coded according to the frame code of the loading frame; then respective process information of the each solar cell during manufacture is acquired according to a loading order of the solar cells, where the process information includes a code of a process carrier, a code of a workbench and a position code of a solar cell in the process carrier or the like; then cell codes and process information of the solar cells is uploaded to a computer system; the computer system records the cell codes and the process information of the solar cells, and associates each cell code of the cell codes with respective process information. By coding each solar cell according to the frame code of the loading frame and the loading order, each solar cell can be accurately marked and identified. By recording and associating the process information acquired according to the loading order and the respective cell code, the process information of the solar cells can be accurately recorded, which facilitates the trace of the process information at the solar cell level and is conducive to subsequent optimization of manufacture processes of the solar cells according to the process information of the solar cells.

Figure 4:
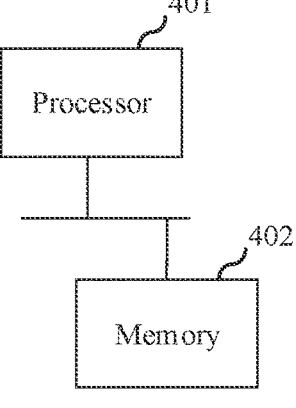
FIG. 4 is a structural schematic diagram of a transport device for solar cells according to some embodiments of the present disclosure.

Embodiments of the present disclosure further provide a transport device for solar cells. FIG. 4 is a structural schematic diagram of the transport device for solar cells, which includes: at least one processor 401; and a memory 402 being in communication connection with the at least one processor 401. The memory 402 is configured to store instructions, which, when executed by the at least one processor 401, causes the at least one processor 401 to implement operations of the method for tracing solar cells as illustrated above.

The memory and the at least one processor are connected by a bus which may include random number of interconnected buses and bridges, and the bus connects the circuits of the memory and of the at least one processor to each other. The bus may also connect various other circuits, such as peripheral devices, voltage regulators and power management circuits, to each other, which are well known in the art. Therefore, the present disclosure will not further illustrate. Bus interface provides the interface between the bus and transceiver. The transceiver may include one device or multiple devices, such as a plurality of receivers and transmitters, to provide a unit for communicating with various other devices on the transmission medium. The data processed by the at least one processor is transmitted on the wireless medium through the antenna. Further, the antenna also receives data and transmits the data to the at least one processor.

The at least one processor is responsible for bus management and general processing, and may provide various functions, including timing, peripheral interface, voltage regulation, power management and other control functions. The memory may be configured to store the data used by the at least one processor when executing the instructions.

Although the present disclosure is disclosed above with exemplary embodiments, they are not used to limit the claims. Any person skilled in the art can make some possible changes and modifications without departing from the concept of the present disclosure. The scope of protection of the present disclosure shall be subject to the scope defined by the claims.

Those having ordinary skill in the art shall understand that the above embodiments are exemplary implementations for realizing the present disclosure. In practice, any person skilled in the art to which the embodiments of the present disclosure belong may make any modifications and changes in forms and details without departing from the scope of the present disclosure. Therefore, the patent protection scope of the present disclosure shall still be subject to the scope limited by the appended claims.

What is claimed is:

1. A method for tracing solar cells, comprising:
coding solar cells disposed in a loading frame according to a frame code of the loading frame, such that each respective solar cell has a respective cell code;
obtaining respective process information of the respective solar cell according to a loading order in which the solar cells are transferred from the loading frame to a transport and grouping apparatus, wherein the respective process information includes a code of a process carrier configured to carry the solar cells, a code of a workbench configured to process the solar cells and a position code of the respective solar cell in the process carrier;
uploading cell codes and process information of the solar cells to a computer system; and
recording, by the computer system, the cell codes and the process information of the solar cells, and associating, by the computer system, the respective cell code with the respective process information.

2. The method according to claim 1, wherein coding the solar cells disposed in the loading frame according to the frame code of the loading frame, includes:
determining a cell code set for the solar cells according to the frame code of the loading frame, wherein the cell code set includes a plurality of cell codes;
assigning a respective cell code in the cell code set to the respective solar cell according to the loading order; and
caching the cell codes of the solar cells.

3. The method according to claim 2, wherein determining the cell code set for the solar cells according to the frame code of the loading frame, includes:
uploading the frame code of the loading frame to the computer system;
determining, by the computer system, a maximum capacity of the loading frame according to the frame code of the loading frame;
generating, by the computer system, the cell code set, wherein a number of the cell codes in the cell code set corresponds to the maximum capacity; and
receiving the cell code set transmitted by the computer system.

4. The method according to claim 2, wherein caching the cell codes of the solar cells, includes:
receiving triggering information and cut-off information of a first sensor and triggering information and cut-off information of a second sensor, wherein the first sensor is disposed at an end of a transferring line configured for transferring the solar cells from the loading frame to the transport and grouping apparatus, and the second sensor is disposed at an inlet of the transport and grouping apparatus; and
during transfer of the respective solar cell from the loading frame to the transport and grouping apparatus, in response to the triggering information of the first sensor being received prior to the triggering information of the second sensor and the cut-off information of the first sensor being received prior to the cut-off information of the second sensor, caching a cell code of the respective solar cell.

5. The method according to claim 1, after coding the solar cells disposed in the loading frame according to the frame code of the loading frame, further including:

receiving an output signal of a third sensor configured to monitor a respective state of each solar cell of the solar cells;

determining a target solar cell according to the output signal, wherein the target solar cell refers to a damaged solar cell; and deleting a cell code corresponding to the target solar cell.

6. The method according to claim 1, wherein the solar cells are transferred from the transport and grouping apparatus to the process carrier by a mechanical arm, and uploading the cell codes and process information of the solar cells to the computer system, includes:

acquiring position information of the mechanical arm, to determine whether the mechanical arm returns to an initial position; and in response to determining that the solar cells are transferred to the process carrier and the mechanical arm returns to the initial position, uploading the cell codes and process information of the solar cells to the computer system.

7. The method according to claim 6, wherein each solar cell of the solar cells further has a process code configured to indicate information of respective preceding processes performed on the respective solar cell, after uploading the cell codes and process information of the solar cells to the computer system, the method further includes:

determining the respective cell code of each solar cell according to an unloading order in which the solar cells are transferred from the process carrier to the transport and grouping apparatus;

acquiring a respective process code of the respective solar cell; and associating the respective cell code with the respective process code of the respective solar cell.

8. The method according to claim 7, wherein determining the respective cell code of each solar cell according to the unloading order in which the solar cells are transferred from the process carrier to the transport and grouping apparatus, includes:

sending a request to the computer system for the cell codes of the solar cells, wherein the request includes the code of the process carrier and the code of the workbench;

receiving a collection of the cell codes sent by the computer system in response to the request; and determining the respective cell code of each solar cell of the collection of the cell codes according to the unloading order.

9. The method according to claim 7, after associating the respective cell code with the respective process code of the respective solar cell, further including:

acquiring a frame code of an unloading frame configured to receive the solar cells unloaded from the transport and grouping apparatus;

uploading the cell codes and process codes of the solar cells and the frame code of the unloading frame to the computer system; and recording, by the computer system, the cell codes and the process codes of the solar cells and the frame code of the unloading frame, and associating, by the computer system, the frame code of the unloading frame with the cell codes and the process codes of the solar cells.

10. The method according to claim 8, after sending the request to the computer system for the cell codes of the solar cells, the method includes:

in response to receiving the request, retrieving, by the computer system, in the process information according to codes of the process carrier and the workbench carried in the request, to determine solar cells whose process information includes codes of the process carrier and the workbench identical to those carried in the request;

determining, by the computer system, the unloading order of the solar cells according to position codes of the solar cells in the process carrier;

sorting, by the computer system, the cell codes of the solar cells according to the unloading order to generate the collection of the cell codes; and sending, by the computer system, the collection of the cell codes in response to the request.

11. A non-transitory computer readable storage medium storing a program that, when executed on at least one processor, causes the at least one processor to perform operations to carry out a method for tracing solar cells, wherein the method comprises:

coding solar cells disposed in a loading frame according to a frame code of a loading frame, such that the respective solar cell has a respective cell code;

obtaining respective process information of the respective solar cell according to a loading order in which the solar cells are transferred from the loading frame to a transport and grouping apparatus, wherein the respective process information includes a code of a process carrier configured to carry the solar cells, a code of a workbench configured to process the solar cells and a position code of the respective solar cell in the process carrier;

receiving cell codes and process information of the solar cells sent to the software system; and recording, by the software system, the cell codes and the process information of the solar cells, and associating, by the software system, the respective cell code with the respective process information.

12. The non-transitory computer readable storage medium according to claim 11, wherein coding the solar cells disposed in the loading frame according to the frame code of the loading frame includes:

determining a cell code set for the solar cells according to the frame code of the loading frame, wherein the cell code set includes a plurality of cell codes;

assigning a respective cell code in the cell code set to the respective solar cell according to the loading order; and caching the cell codes of the solar cells.

13. The non-transitory computer readable storage medium according to claim 12, wherein determining the cell code set for the solar cells according to the frame code of the loading frame includes:

receiving the frame code of the loading frame sent to the computer system;

determining, by the computer system, a maximum capacity of the loading frame according to the frame code of the loading frame;

generating, by the computer system, the cell code set, wherein a number of the cell codes in the cell code set corresponds to the maximum capacity; and receiving the cell code set transmitted by the computer system.

14. The non-transitory computer readable storage medium according to claim 12, wherein caching the cell codes of the solar cells includes:

receiving triggering information and cut-off information of a first sensor and triggering information and cut-off information of a second sensor, wherein the first sensor is disposed at an end of a transferring line configured for transferring the solar cells from the loading frame to the transport and grouping apparatus, and the second sensor is disposed at an inlet of the transport and grouping apparatus; and during transfer of the respective solar cell from the loading frame to the transport and grouping apparatus, in response to the triggering information of the first sensor being received prior to the triggering information of the second sensor and the cut-off information of the first sensor being received prior to the cut-off information of the second sensor, caching a cell code of the respective solar cell.

15. The non-transitory computer readable storage medium according to claim 11, after coding each solar cell of the solar cells according to the frame code of the loading frame, the method further comprises:

receiving an output signal of a third sensor configured to monitor a respective state of each solar cell of the solar cells;

determining a target solar cell according to the output signal, wherein the target solar cell refers to a damaged solar cell; and deleting a cell code corresponding to the target solar cell.

16. The non-transitory computer readable storage medium according to claim 11, wherein the solar cells are transferred from the transport and grouping apparatus to the process carrier by a mechanical arm, and receiving the cell codes and process information of the solar cells sent to the computer system includes:

acquiring position information of the mechanical arm, to determine whether the mechanical arm returns to an initial position; and in response to determining that the solar cells are transferred to the process carrier and the mechanical arm returns to the initial position, receiving the cell codes and process information of the solar cells sent to the computer system.

17. The non-transitory computer readable storage medium according to claim 16, wherein each solar cell of the solar cells further has a process code configured to indicate information of respective preceding processes performed on the respective solar cell, after receiving the cell codes and process information of the solar cells sent to the computer system, the method further comprises:

determining the respective cell code of each solar cell according to an unloading order in which the solar cells are transferred from the process carrier to the transport and grouping apparatus;

acquiring a respective process code of the respective solar cell; and associating the respective cell code with the respective process code of the respective solar cell.

18. The non-transitory computer readable storage medium according to claim 17, wherein determining the respective cell code of each solar cell according to the unloading order in which the solar cells are transferred from the process carrier to the transport and grouping apparatus includes:

sending a request to the computer system for the cell codes of the solar cells, wherein the request includes the code of the process carrier and the code of the workbench;

receiving a collection of the cell codes sent by the computer system in response to the request; and determining the respective cell code of each solar cell of the collection of the cell codes according to the unloading order.

19. The non-transitory computer readable storage medium according to claim 17, after associating the respective cell code with the respective process code of the respective solar cell, the method further comprises:

acquiring a frame code of an unloading frame configured to receive the solar cells unloaded from the transport and grouping apparatus;

receiving the cell codes and process codes of the solar cells and the frame code of the unloading frame sent to the computer system; and recording, by the computer system, the cell codes and the process codes of the solar cells and the frame code of the unloading frame, and associating, by the computer system, the frame code of the unloading frame with the cell codes and the process codes of the solar cells.

20. The non-transitory computer readable storage medium according to claim 18, after sending the request to the computer system for the cell codes of the solar cells, the method further comprises:

in response to receiving the request, retrieving, by the computer system, in the process information according to codes of the process carrier and the workbench carried in the request, to determine solar cells whose process information includes codes of the process carrier and the workbench identical to those carried in the request;

determining, by the computer system, the unloading order of the solar cells according to position codes of the solar cells in the process carrier;

sorting, by the computer system, the cell codes of the solar cells according to the unloading order to generate the collection of the cell codes; and sending, by the computer system, the collection of the cell codes in response to the request.

* * * * *